US008234085B2

(12) United States Patent
Montanari et al.

(10) Patent No.: US 8,234,085 B2
(45) Date of Patent: Jul. 31, 2012

(54) METHOD FOR PROCESSING DATA PERTAINING TO AN ACTIVITY OF PARTIAL ELECTRICAL DISCHARGES

(75) Inventors: Gian Carlo Montanari, Casalecchio Di Remo (IT); Andrea Cavallini, San Pietro In Casale (IT); Gaetano Pasini, Marano Sul Panaro (IT)

(73) Assignee: Techimp Technologies S.R.L., Bologna (IT)

( * ) Notice: Subject to any disclaimer, the term of this patent is extended or adjusted under 35 U.S.C. 154(b) by 306 days.

(21) Appl. No.: 12/525,763

(22) PCT Filed: Jan. 25, 2008

(86) PCT No.: PCT/IB2008/050272
§ 371 (c)(1),
(2), (4) Date: Oct. 28, 2009

(87) PCT Pub. No.: WO2008/096284
PCT Pub. Date: Aug. 14, 2008

(65) Prior Publication Data
US 2010/0114509 A1    May 6, 2010

(30) Foreign Application Priority Data
Feb. 8, 2007  (IT) .............................. PR2007A0006

(51) Int. Cl.
*G01R 31/06* (2006.01)
(52) U.S. Cl. ......................................... 702/58; 324/536
(58) Field of Classification Search .................... 702/58, 702/57; 324/76.77, 536; 363/40, 65
See application file for complete search history.

(56) References Cited

U.S. PATENT DOCUMENTS

| 6,064,172 | A | 5/2000 | Kuznetsov |
| 6,313,640 | B1 * | 11/2001 | Nasrallah et al. ............. 324/536 |
| 7,602,627 | B2 * | 10/2009 | Ohshima et al. ............... 363/97 |
| 2003/0122521 | A1 * | 7/2003 | Colombo ....................... 318/700 |
| 2005/0218906 | A1 | 10/2005 | Younsi et al. |
| 2005/0218907 | A1 | 10/2005 | Lee et al. |

FOREIGN PATENT DOCUMENTS

| JP | 11304864 A | 11/1999 |
| JP | 2004045307 A | 2/2004 |
| JP | 2005274440 A | 10/2005 |

* cited by examiner

*Primary Examiner* — Bryan Bui
(74) *Attorney, Agent, or Firm* — Pearne & Gordon LLP

(57) ABSTRACT

A method for measuring and processing data pertaining to an activity of partial electrical discharges taking place in a three-phase electric machine (1) powered with square wave voltage, said data comprising a plurality of discharge signals and a plurality of sets of three values ($e_u$, $e_v$, $e_w$) of power supply voltage of the machine measured in concurrence with a corresponding discharge signal, comprises the following steps:
—transforming each set ($e_u$, $e_v$, $e_w$) of three voltage values measured into a corresponding pair ($e_d$, $e_q$) of voltage values;
—deriving a phase angle value from each of said pairs ($e_d$, $e_q$) of voltage values; —attributing to each discharge signal the corresponding phase value, to assess the measured discharge signals as a function of corresponding phase values. Prior art techniques for processing data pertaining to activity of partial electrical discharges taking place in three phase electric machines powered with square wave voltage provide for assessing the measured discharged signals as a time sequence of events, with no possibility to place them effectively in relation to the power supply voltages, this entailing that any subsequent statistical processing of the measured data will have little significance.

12 Claims, 3 Drawing Sheets

METHOD FOR PROCESSING DATA PERTAINING TO AN ACTIVITY OF PARTIAL ELECTRICAL DISCHARGES

TECHNICAL FIELD AND BACKGROUND ART

The present invention relates to a method for processing data pertaining to an activity of partial electrical discharges taking place in a three-phase electric machine powered with square wave voltage, said data comprising a plurality of discharge signals and a plurality of sets of three values of power supply voltage of the machine, each set of three voltages being measured in concurrence with a corresponding discharge signal. In particular, the present invention relates to a method for evaluating for diagnostic purposes an activity of partial electrical discharges in a three-phase electrical motor powered with square wave, e.g. by means of an electronic power converter operating in PWM logic.

Electronic power converters enable to control induction motors in an extremely effective manner, allowing to transform electrical energy into mechanical energy with great flexibility. On the other hand, the voltage wave forms which converters impose to the terminals of the motor have proven to be extremely harmful with respect to the duration of the insulation, particularly in motors built with enameled wire windings.

The research conducted throughout the world has shown that the electrical stresses at the terminals of motors driven by converters can be considerably high, causing the phenomenon of partial discharges (PD). PDs are discharges of small amplitude that do not short-circuit the electrodes, but cause a progressive degradation of the insulating system. This degradation process can be particularly rapid in deteriorating organic dielectrics like the enamels used in the insulation of the motor wires. Relatively slower is instead the degradation of dielectrics containing inorganic materials (mica, titanium dioxide) in an organic matrix (resin or polymeric paint). In any case, the possibility of verifying whether partial discharges occur or not in a motor driven by a converter, and of quantifying any such phenomena, has great importance for diagnostic purposes, or to prevent failures during operation.

However, the measure of the PDs in motors driven by means of converter and, above all, the subsequent assessment of the results of the measurements present some problems.

In the first place, particularly in new-generation, low voltage converters, the up ramps of the voltage wave forms may have a considerable slope, in the order, for example, of tens of kV per microsecond. These wave forms of the power supply voltage generate interference constituted by signals having a high frequency content and can conceal the presence of the partial discharges, if the sensors used for the measurement are not appropriately selected.

To the problem of measuring the signals associated to the PDs is added the difficulty in recognising any interference, and in interpreting and rationalising the results of the measurement itself.

In this light, it should be noted that, in order effectively to assess for diagnostic purposes the signals pertaining to a partial discharge activity, it is important to relate each measured discharge signal to the voltage that produced it. Relating a signal in a PD measurement to the voltage that produced it has two fundamental purposes.

A first purpose is to determine, within a three-phase machine, which insulation section is affected by the discharge.

A second purpose is to verify whether the measured signals are correlated with the power supply voltages (which generally have a substantially periodic profile). In this way, it is possible to discriminate the measurement noise from partial discharges and to verify the integrity of the insulating system.

To date, no systems are known for systematically relating a signal measured in a measurement of partial discharges to the voltage that produced it in the case of measurements performed on three-phase machines powered with square wave (e.g. with PWM logic), especially in the cases in which the signals of partial discharges are measured by means of a single sensor, shared by the three power supply phases (antenna).

Known techniques provide for assessing the measured signals as a time succession of events, with no possibility of relating them effectively to the power supply voltages. Therefore, all subsequent statistical processing of the measured data has little significance, if not altogether erroneous, because it is based on the processing of a heterogeneous set of data, comprising discharge signals pertaining to different portions of the insulating system (i.e. corresponding to discharges produced by voltages of different phases) together with signals relating to interference.

DISCLOSURE OF INVENTION

The object of the present invention is to eliminate the aforesaid drawbacks and to make available a method for processing data pertaining to an activity of partial electrical discharges taking place in a three-phase electric machine powered with square wave voltage, said data comprising a plurality of discharge signals and a plurality of sets of three values of power supply voltage of the machine, such as to relate each measured signal to the power supply voltages.

Said object is fully achieved by the method of the present invention, which is characterised by the content of the appended claims and in particular in that it comprises the following steps:
  transforming each set of three voltage values measured into a corresponding pair of voltage values;
  deriving a phase value from each of said pairs of voltage values, by representing the pairs in polar co-ordinates;
  attributing to each discharge signal the corresponding phase value, to assess the measured discharge signals as a function of corresponding phase values.

BRIEF DESCRIPTION OF DRAWINGS

This and other characteristics shall become more readily apparent from the following description of a preferred embodiment, illustrated purely by way of non limiting example in the accompanying drawing tables, in which.

BEST MODE FOR CARRYING OUT THE INVENTION

Figure 1:
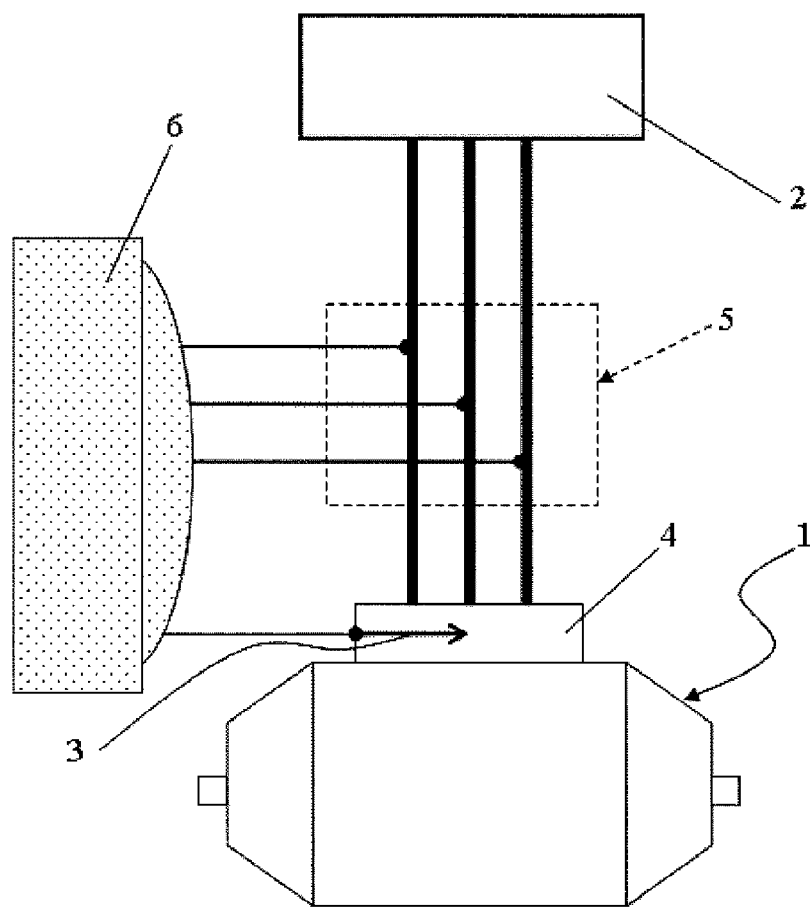
FIG. 1 schematically shows a three-phase electric machine whereto is applied a method according to the present invention.

In FIG. 1, the reference number 1 indicates a three-phase electric machine (e.g. an asynchronous induction motor) powered with square wave voltage. In particular, the machine 1 is powered by a power converter 2, e.g. an inverter operating in PWM logic.

The present invention makes available a method for processing data pertaining to an activity of partial electrical discharges taking place in the three-phase electric machine 1 powered with square wave voltage, said data comprising a plurality of discharge signals and a plurality of sets of three values ($e_U$, $e_V$, $e_W$) of power supply voltage of the machine 1, each set of three voltages being measured in concurrence with a corresponding discharge signal.

More in general, the present invention makes available a method for assessing for diagnostic purposes an activity of partial electrical discharges taking place in the machine 1, comprising, for the measurement of the data to be processed, the following steps:

measurement of a plurality of discharge signals, associated with said partial electrical discharges;

measuring a set of three values of voltage ($e_U$, $e_V$, $e_W$) powering the machine, in is concurrence with each measured discharge signal.

With regard to the processing of said data, the method originally comprises the following steps:

transforming each set of three voltage values measured into a corresponding pair of voltage values ($e_d$, $e_q$);

deriving a phase value from each of said pairs of voltage values;

attributing to each discharge signal the corresponding phase value, to assess the measured discharge signals as a function of corresponding phase values.

With regard to the step of measuring the discharge signals, a sensor 3 is used, e.g. an antenna coupled to the terminal board 4 of the electric machine 1.

In this light, it should be noted that a problem of the measurement of partial discharges in motors powered by means of PWM converter consists of the partial superposition (in the frequency domain) of the discharge signal to be measured with the interference generated by the commutations of the switches of the power converter. In this light, the method in question provides for the use of an ultra-broad band sensor and of appropriate filters for the rejection of the interference due to the converter, according to a substantially known technique.

In particular, it is possible to use an antenna inserted inside the motor and high-pass filters (typical cut-off frequencies 300-500 MHz) to draw the signal from motors powered by low voltage converters, where the up-ramp times of the commutations of the inverter assume values from 50 to 300 ns. In low voltage applications, the up-ramp times are so short and the interference consequently generated are so large and at high frequency that only the antennas are able to detect a partial discharge signal with a sufficiently high signal/noise ratio (the antenna therefore constitutes a sensor common to all the phases). This application is the most unfavourable with respect to the possibility of associating a discharge signal to the voltage that generated it, therefore it is to it that the method in question is particularly referred.

It should be noted that, in medium voltage drives, where the up-ramps of the commutations are far longer (>1 microsecond), it is possible to use a sensor for each phase, constituted for example by a radio frequency transformer, with high-pass filters characterised by lower cut-off frequencies.

With regard to the step of measuring a set of three voltage values ($e_U$, $e_V$, $e_W$) supplying power to the machine 1, for example probes 5 are used to measure the instantaneous values of the voltages at the terminals of the machine 1. These probes 5 are provided with a bandwidth commensurate to the frequency of the voltages applied to the machine 1. In particular, it is possible to use resistive dividers with reliability characteristics commensurate to those of the machine 1.

The measured values of the discharge signals and of the power supply voltages are transmitted to a processing instrument 6, for their storage/processing.

In particular, according to the method in question, said processing comprises said transforming, deriving and attributing steps.

With regard to the step of transforming each measured set of three voltage values ($e_U$, $e_V$, $e_W$) into a corresponding pair of voltage values ($e_d$, $e_q$), originally, each measured set of three voltage values (arranged as a three-number vector) is multiplied times a predetermined matrix, such as to exclude the zero sequence component. Preferably, said predetermined matrix is determined in such a way that each pair of voltage values obtained constitutes the direct and square components of the corresponding three-value set.

Said predetermined matrix can be constituted, for example, by Park's matrix (i.e. the matrix corresponding to the Park transform known, in the sector of electric drives, to is correlate a value of drive current of the machine to a value of torque delivered by the machine), shown in the formula that follows.

$$\begin{pmatrix} e_d \\ e_q \end{pmatrix} = \sqrt{2/3} \begin{bmatrix} 1 & -1/2 & -1/2 \\ 0 & \sqrt{3}/2 & -\sqrt{3}/2 \end{bmatrix} \cdot \begin{pmatrix} e_U \\ e_V \\ e_W \end{pmatrix}$$

Alternatively, for example, any matrix obtained multiplying said Park matrix times any 2×2 matrix of maximum rank can be used.

With regard the step of deriving a phase value from each of said pairs of voltage values ($e_d$, $e_q$), the pairs itself are represented in polar co-ordinates. In practice, the pairs of voltage values ($e_d$, $e_q$) are represented in a plane (of the type shown in FIGS. 2, 5 and 7) in which a Cartesian reference is defined, so that $e_d$ is show in the x-axis and $e_q$ is shown in the y-axis; the angle formed by the line joining each point with the origin of said Cartesian reference, relative to the positive direction of the x-axis.

The step of attributing to each discharge signal the corresponding phase value originates from the assumption that said phase value is derived from a set of three voltage values (or by a pair of voltage values obtained, in turn, from said set of three voltage values) that univocally corresponds to said discharge signal, because it was measured simultaneously to the signal itself.

Said attribution to the discharge signals of the corresponding phase value enables to assess the measured discharge signals as a function of corresponding phase values.

In this light, the method of the present invention originally comprises a step of separating the measured discharge signals into classes, on the basis of the respective attributed phase values.

Figure 3:
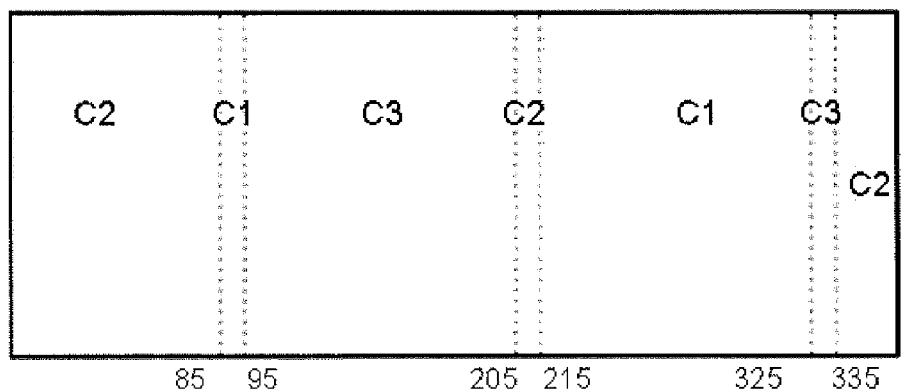
FIG. 3 shows a correlation diagram between derived phases and classes of discharge events.

In particular, a step is provided of separating the measured discharge signals into three classes (called C1, C2, C3), as schematically shown in FIG. 3 (the numeric values shown in the x-axis of FIG. 3 are expressed in degrees). I.e., said classes substantially correspond to the following phase intervals (expressed in degrees):

[85, 95] and [215, 325] for the first class, i.e. the class C1;
[205, 215] and [335, 85] for the second class, i.e. the class C2;
[325, 335] and [95, 205] for the third class, i.e. the class C3;

The phase values thus derived are in relation with the logic states of the converter.

Figure 2:
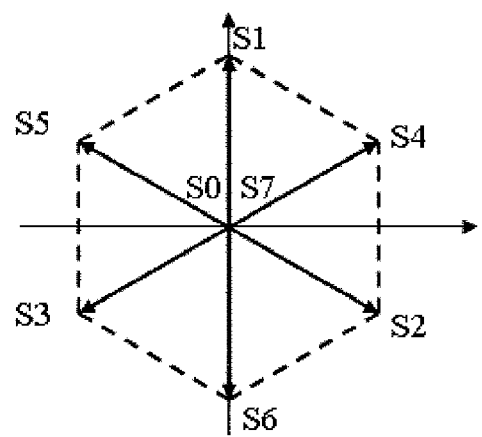
FIG. 2 shows a correlation diagram between transformed voltages and logic states of the converter.

The voltage values ($e_d$, $e_q$) obtained in the transformation step (and from which said phase values are derived) are in relation with the logic states of the converter, as shown schematically in FIG. 2. In FIG. 2, the logic states of the converter, of which there are eight, are designated S1, S2, S3, S4, S5, S6, S7, S8. Said logic states of the converter are correlated to the sets of three values ($e_U$, $e_V$, $e_W$) of power supply voltage (i.e. output by the converter), according to the following table (which contains a 0 when voltage is nil and a 1 when voltage is equal to the value of direct voltage delivered by the converter).

| Converter logic state | $e_U$ | $e_V$ | $e_W$ | Class |
|---|---|---|---|---|
| S0 | 0 | 0 | 0 | — |
| S1 | 1 | 0 | 0 | C1 |
| S2 | 0 | 1 | 0 | C3 |
| S3 | 0 | 0 | 1 | C2 |
| S4 | 1 | 1 | 0 | C2 |
| S5 | 1 | 0 | 1 | C3 |
| S6 | 0 | 1 | 1 | C1 |
| S7 | 1 | 1 | 1 | — |

Therefore, said classes (C1, C2, C3) are in relation with the logic states of the converter and consequently they are correlated with the voltages that, instantaneously, generate the discharge signals.

Thus, the step of attributing to each discharge signal the corresponding phase value advantageously enables to obtain valuable information about the phases (windings and related insulation) in which the partial discharges originate.

In particular, the following applies.

The discharge signals with phase values corresponding to the class C1 are generated by the winding of the phase U, i.e. they take place between the phases U and V and/or between the phases U and W.

The discharge signals with phase values corresponding to the class C2 are generated by the winding of the phase V, i.e. they take place between the phases V and U and/or between the phases V and W.

The discharge signals with phase values corresponding to the class C3 are generated by the winding of the phase W, i.e. they take place between the phases W and V and/or between the phases W and U.

The method in question also comprises, originally, a step of statistically processing the values of amplitude of the discharge signals as a function of the phase values attributed.

In this light, the following should be preliminarily observed.

The amplitude of a discharge signal can be measured by means of a system for detecting a peak value of the signal operating directly on the PD signal or downstream of a system for measuring the power of the radio-frequency signal (to reduce the bandwidth of the signal and use more economical hardware).

Overall, each measurement (i.e., each individual passage of the data measurement step) entails measuring an amplitude of a partial discharge signal and the three values of power supply voltage measured at the instant in which the partial discharge occurs. Therefore, a set of data constituted by a value of amplitude of a discharge is signal and by the corresponding set of three voltage values provides a representation of a single discharge event.

In this regard, the present invention also makes available, originally, a manner of representing discharge events that is particularly significant for diagnostic purposes. Said manner of representing discharge events comprises calculating the distribution of the amplitudes of the discharge signals as a function of the corresponding phase values.

Figure 4:
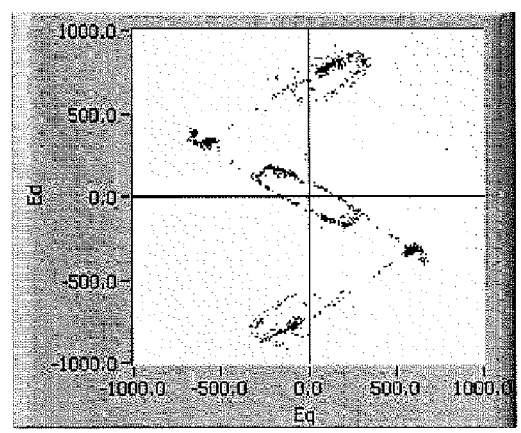
FIG. 4 shows a representation of discharge events as a function of transformed voltages, relative to a first set of data.
Figure 6:
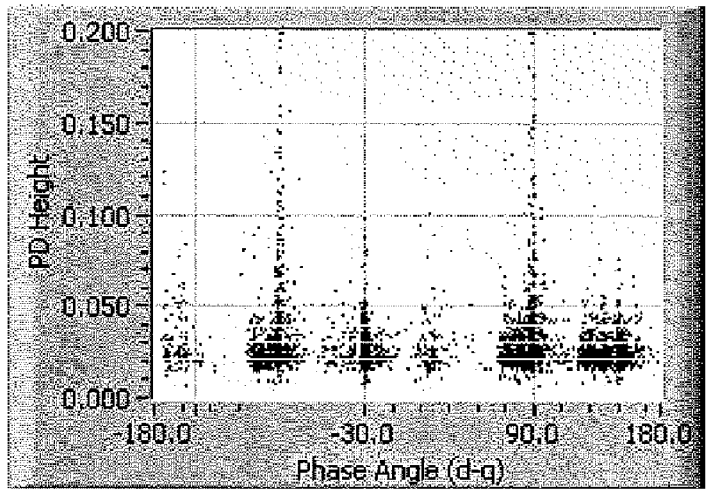
FIG. 6 shows the representation of FIG. 4, relative to a second set of data.

Graphically, said manner of representation comprises representing the experimental results in a plane having on the x-axis the phase values and on the y-axis the amplitudes of the PD, as shown in FIGS. 4 and 6 (in FIGS. 4 and 6), the phase values are expressed in degrees, whilst the values of the amplitudes are expressed in V).

Thus, said step of statistically processing the values of amplitude of the discharge signals as a function of the phase values attributed is originally based on said distribution of the amplitudes.

In particular, it should be noted that the step of statistically processing the amplitude values of the discharge signals (as a function of the attributed phase values) is originally conducted on the data pertaining to a predetermined class, thereby making the result of the processing more significant.

I.e., the present invention comprises, after the step of attributing the phase values to the measured discharge signals, the steps of separating the signals into homogeneous classes and subsequently the step of statistically processing the data pertaining to a single class.

The present method also comprises, originally, a step of rejecting noise, on the basis of said phase values attributed to the measured signals.

For example, noise rejection can be based on the following observations (originally derived from the studies and experimentation conducted by the Applicant). When the incoming signal is noise, it tends to have constant amplitude in a certain interval; moreover, it assumes all possible phase values in undifferentiated fashion. Partial discharge signals, on the other hand, have greater variability with regard to amplitudes and tend to be distributed asymmetrically among the phases (there is almost always one phase that predominates over the others, as the accompanying figures show).

Therefore, the method according to the present invention presents the following advantages.

It enables to provide a diagnostic assessment of PD activities in the machine 1, making available a method for assessing the measured discharge signals relative to corresponding phase values correlated to the values of the voltages that generated the discharges.

It makes available a method for separating discharge signals into classes, grouping the discharge signals that took place in the same electrical conditions of the machine 1 (and therefore constituting a homogeneous set of data), or in similar conditions (or that took place in the windings/insulation of the same phases); said separation making particularly significant each statistical assessment, applied to a homogeneous set of data.

It enables to reject any signals due to noise or interference which may have been detected, based on said phase values and on the variability of the measured signals attributed to each detected signal.

Hereafter is described a practical example of application of the method of the present invention.

The example discusses the processing of detected data into measures of partial discharges conducted on a low voltage motor; in particular, it refers to a first set of data (FIGS. 4 and 5) and to a second set of data (FIGS. 6 and 7), obtained in two successive measurement sessions.

The motor is powered by means of PWM inverter and connected thereto by means of a 25 meter cable in order to promote partial discharge processes. PDs are measured by means of an antenna positioned within the motor casing, in the area of the winding terminals.

FIG. 4 shows a discharge trace, i.e. it represents the transformed pair of voltages ($e_d$, $e_q$), each pair corresponding to a partial discharge event and being represented as a point in a plane having $e_d$ in the x-axis and $e_q$ in the y-axis (as in the case of FIG. 2).

Figure 5:
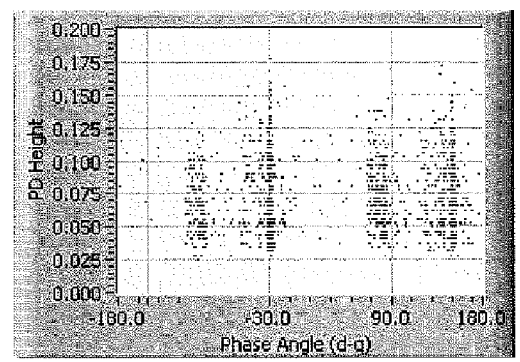
FIG. 5 shows a representation of discharge amplitudes as a function of derived phases, relative to a first set of data.

FIG. 5 shows the distribution of the discharge amplitudes as a function of the corresponding phase values, each phase being attributed to a discharge signal.

FIGS. 4 and 5 represent an activity of partial discharges in a phase of advance of the processes of degradation of the windings/insulation of the machine.

From FIGS. 4 and 5 it is readily apparent that the activity of the PDs (in terms of intensity and amplitude of the measured discharge signals) is particularly concentrated at the logic states S1 and S2 of the inverter, hence at the class C1; moreover, several other degradation processes are active in other portions of the windings, as indicated by the presence in FIG. 5 of additional concentrations of points (i.e. partial discharge events).

Figure 7:
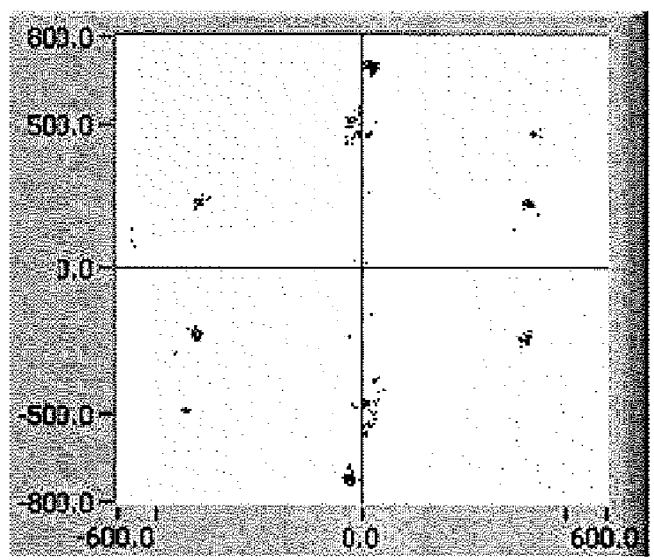
FIG. 7 shows the representation of FIG. 5, relative to a second set of data.

FIGS. 6 and 7 show the result of the measurements made shortly prior the failure of the motor, by effect of the rupture of the winding of the phase U. FIGS. 6 and 7 show that the discharge events at the logic states S1 and S2 of the inverter have increased further, with values of amplitude of the PDs of up to 120 mV.

The invention claimed is:

1. A method for processing data pertaining to an activity of partial electrical discharges taking place in a three-phase electric machine (1) powered with square wave voltage by a power converter (2), for the purpose of assessing for diagnostic purposes the activity of partial discharges taking place in the machine (1), said data comprising a plurality of discharge signals associated with said partial electrical discharges and a plurality of sets of three values ($e_U$, $e_V$, $e_W$) of power supply voltage of the machine (1), each set measured in concurrence with a corresponding discharge signal,
wherein said method comprises the following steps:
   transforming each set ($e_U$, $e_V$, $e_W$) of three voltage values measured into a corresponding pair ($e_d$, $e_q$) of voltage values;
   deriving a phase angle value from each of said pairs ($e_d$, $e_q$) of voltage values, the derived phase angle values being in relation to logic states of the converter (2);
   attributing to each discharge signal associated with a corresponding partial electrical discharge the corresponding phase angle value, to assess the measured discharge signals as a function of corresponding phase angle values.

2. The method as claimed in claim 1, wherein said three phase electric machine (1) is powered by a converter (2) operating in PWM logic.

3. The method as claimed in claim 1, wherein said transformation step comprises multiplying each measured set of three voltages ($e_U$, $e_V$, $e_W$) times a predetermined matrix, able to remove from said set of three voltages the zero sequence component.

4. The method as claimed in claim 3, wherein said predetermined matrix is a matrix obtainable multiplying a Park matrix times any 2×2 matrix of maximum rank.

5. The method as claimed in claim 1, comprising a step of separating the discharge signals into classes on the basis of the respective attributed phase values.

6. The method as claimed in claim 5, wherein said classes are three and correspond to predetermined phase intervals.

7. The method as claimed in claim 6, wherein said phase intervals are substantially the following:
   [85, 95] and [215, 325] for the first class;
   [205, 215] and [335, 85] for the second class;
   [325, 335] and [95, 205] for the third class.

8. The method as claimed in claim 1, comprising a step of statistically processing the values of amplitude of the discharge signals as a function of the phase values attributed.

9. The method as claimed in claim 5, comprising a step of statistically processing the values of amplitude of the discharge signals of a predetermined class, as a function of the phase values attributed.

10. The method as claimed in claim 1, comprising a step of rejecting noise, on the basis of said phase values attributed to the discharge signals.

11. The method as claimed in claim 1, wherein said plurality of discharge signals is measured through a sensor (3) common to all three phases.

12. A method for assessing for diagnostic purposes an activity of partial electrical discharges taking place in a machine (1) powered with square wave voltage by a power converter (2), the method comprising, for the measurement of the data to be processed, the following steps:
   measuring a plurality of discharge signals, associated with said partial electrical discharges;
   measuring a set of three values of voltage ($e_U$, $e_V$, $e_W$) powering the machine, in concurrence with each measured discharge signal;
   processing data comprising said plurality of discharge signals associated with said partial electrical discharges and said plurality of sets of three values ($e_U$, $e_V$, $e_W$) of power supply voltage of the machine (1), each set measured in concurrence with a corresponding discharge signal, wherein
the processing of said data comprises the following steps:
   transforming each set of three voltage values measured into a corresponding pair of voltage values ($e_d$, $e_q$);
   deriving a phase angle value from each of said pairs of voltage values, the derived phase angle values being in relation to logic states of the converter (2);
   attributing to each discharge signal the corresponding phase value, to assess the measured discharge signals as a function of corresponding phase values.

* * * * *